(12) United States Patent
Yoshikawa

(10) Patent No.: US 8,618,557 B2
(45) Date of Patent: Dec. 31, 2013

(54) WIDE-BAND-GAP REVERSE-BLOCKING MOS-TYPE SEMICONDUCTOR DEVICE

(75) Inventor: Koh Yoshikawa, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 113 days.

(21) Appl. No.: 13/372,807

(22) Filed: Feb. 14, 2012

(65) Prior Publication Data

US 2012/0211768 A1    Aug. 23, 2012

(30) Foreign Application Priority Data

Feb. 21, 2011    (JP) .................... 2011-034298

(51) Int. Cl.
| | | |
|---|---|---|
| H01L 29/15 | (2006.01) | |
| H01L 29/66 | (2006.01) | |
| H01L 23/02 | (2006.01) | |
| H01L 29/02 | (2006.01) | |
| H01L 21/70 | (2006.01) | |
| H01L 21/332 | (2006.01) | |
| H01L 21/84 | (2006.01) | |
| H01L 21/338 | (2006.01) | |

(52) U.S. Cl.
USPC ............. 257/77; 257/135; 257/181; 257/262; 257/328; 257/487; 257/E29.008; 257/502; 438/140; 438/156; 438/173

(58) Field of Classification Search
None
See application file for complete search history.

(56) References Cited

U.S. PATENT DOCUMENTS

| | | | |
|---|---|---|---|
| 7,132,321 B2 | 11/2006 | Kub et al. | |
| 2004/0082116 A1* | 4/2004 | Kub et al. | ............ 438/137 |
| 2006/0267091 A1* | 11/2006 | Takahashi | ............ 257/341 |
| 2010/0224886 A1* | 9/2010 | Iwamuro | ............ 257/77 |

FOREIGN PATENT DOCUMENTS

| | | |
|---|---|---|
| JP | 2002-319676 | 10/2002 |
| JP | 2009-054659 | 3/2009 |
| JP | 2010-258327 | 11/2010 |

* cited by examiner

*Primary Examiner* — Julio J Maldonado
*Assistant Examiner* — Harpreet Singh

(57) ABSTRACT

A wide-band-gap reverse-blocking MOS-type semiconductor device includes a SiC n⁻-type drift layer; a p⁺-type substrate on the first major surface side of the drift layer; a trench extending through a p⁺-type substrate into the drift layer; a titanium electrode in the trench bottom that forms a Schottky junction with the SiC n⁻-type drift layer; an active section including a MOS-gate structure on the second major surface side of the drift layer facing to the area, in which the Schottky junctions are formed; a breakdown withstanding section surrounding the active section; and a trench isolation layer surrounding the breakdown withstanding section, the trench isolation layer extending from the second major surface of the drift layer into p⁺-type substrate and including insulator film buried therein. The device facilitates making a high current flow with a low ON-voltage and exhibits a very reliable reverse blocking capability.

12 Claims, 14 Drawing Sheets

FIG.16(a)
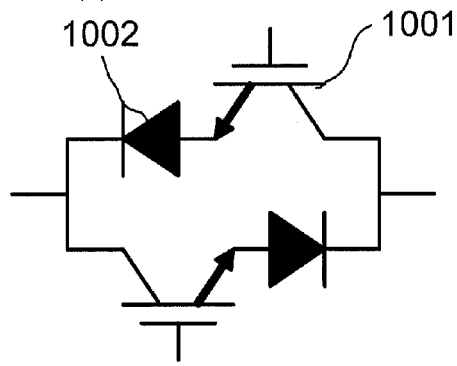
FIG.16(b)
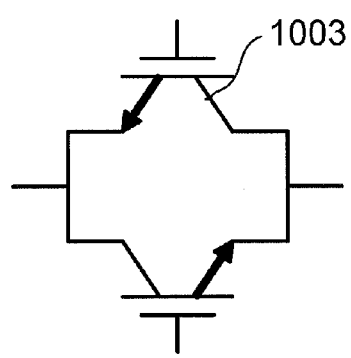
FIG.17
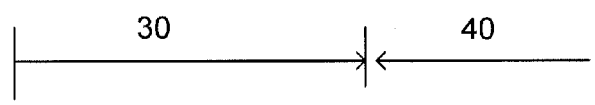
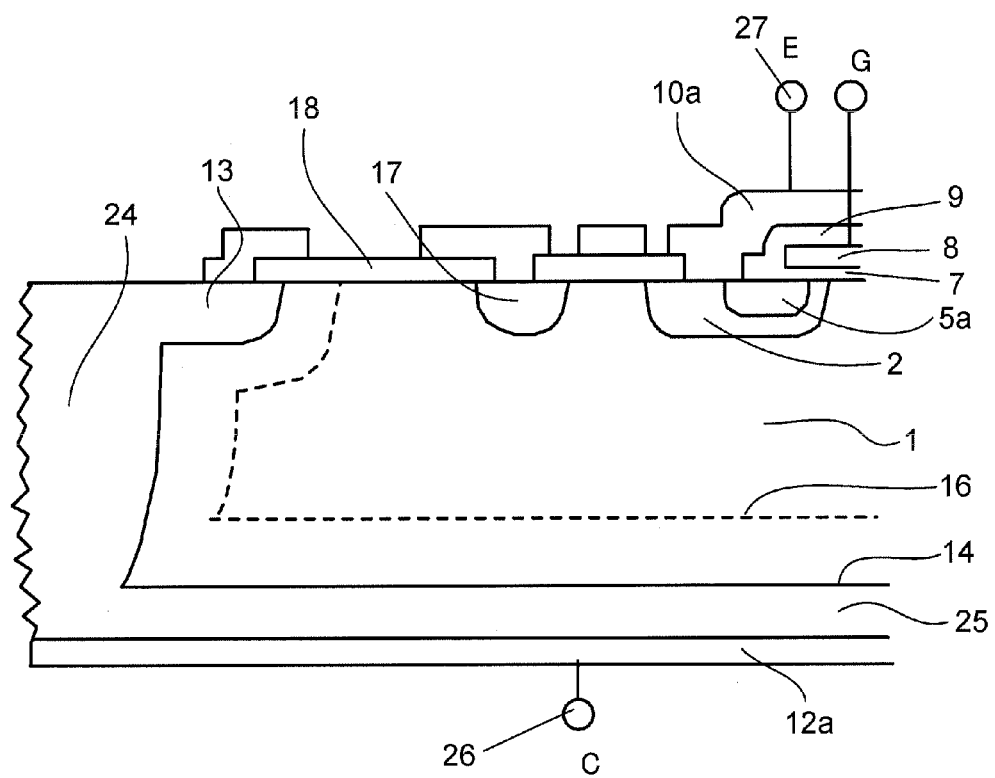

WIDE-BAND-GAP REVERSE-BLOCKING MOS-TYPE SEMICONDUCTOR DEVICE

CROSS-REFERENCE TO RELATED APPLICATIONS

This application claims the benefit under 35 U.S.C. §119 to Japanese Application No. 2011-034298, filed Feb. 21, 2011, in the Japanese Intellectual Property Office, the content of which is incorporated herein by reference.

BACKGROUND

1. Field

Embodiments of the present invention relate to wide-band-gap reverse-blocking MOS-type semiconductor devices which control a high current and a high voltage. Specifically, embodiments of the invention relate to wide-band-gap reverse-blocking MOS-type semiconductor devices which facilitate securing a predetermined breakdown voltage, even if a reverse voltage is applied between the drain and source thereof.

2. Description of the Related Art

Recently, the use of two-way switching devices for matrix converters such as direct-link-type converter circuits has been attracting much attention from the view points of reducing the size thereof, reducing the weight thereof, improving the efficiency thereof, increasing the response speed thereof, and reducing the costs thereof. The direct-link-type converter circuits are used for an AC (alternating current)/AC conversion, an AC/DC (direct current) conversion, and a DC/AC conversion.

The usual inverter/converter combination once converts an AC to an intermediate DC voltage and further converts the intermediate DC voltage to an AC. Since the matrix converter obtains an AC directly from an AC, the power conversion efficiency of the matrix converter is high. Further, the matrix converter is advantageous, since any interposed capacitor is not necessary. Since the inverter/converter combination uses an electrolytic capacitor for the interposed capacitor, it has been troublesome for the life of the inverter/converter combination to be determined by the life of the electrolytic capacitor.

The power device used in the matrix converters is a two-way switching device capable of making a current flow in two directions. The two-way switching device is not configured solely of an elementary transistor. The two-way switching device is configured of two diodes 1002 and two transistors 1001 as described in the equivalent circuit diagram shown in FIG. 16(a). Diode 1002 is connected in series to transistor 1001 in the polarity that facilitates blocking the reverse voltage applied to transistor 1001.

Transistor 1001 as described above includes an insulated-gate bipolar transistor (hereinafter referred to as an "IGBT") and a metal oxide semiconductor field effect transistor (hereinafter referred to as a "MOSFET"), which are capable of controlling the ON and OFF thereof and conducting the current control with the gate thereof. The diode is connected in series to the transistor, since the usual IGBT and MOSFET are not designed such that the breakdown voltage reliability thereof in the reverse direction is secured. Therefore, the breakdown voltage of the usual IGBT and MOSFET implies the breakdown voltage thereof in the forward direction (hereinafter referred to simply as the "forward bias blocking capability"). Recently, a power device called a "reverse-blocking IGBT" has been developed for improving the reliability of the breakdown voltage in the reverse direction. The reverse-blocking IGBT guarantees a breakdown voltage, when a voltage is applied in the reverse direction, (hereinafter referred to as a "reverse bias blocking capability") as reliably as the forward withstand voltage.

FIG. 16(b) is the equivalent circuit diagram of a two-way switching device that employs the reverse-blocking IGBT as described above. The two-way switching device in FIG. 16(b) is configured by connecting two reverse-blocking IGBT's 1003 in opposite parallel to each other. As compared with the two-way switching device described in FIG. 16(a), the two-way switching device in FIG. 16(b) facilitates reducing the number of the parts, reducing the power loses, and reducing the size thereof. Therefore, the two-way switching device described in FIG. 16(b) is advantageous for providing a down-sized matrix converter with low manufacturing costs.

FIG. 17 is the cross sectional view of a semiconductor substrate in the reverse-blocking IGBT as described above showing the edge area thereof schematically.

Fundamentally, the configuration of the section that makes a main current flow (active section 40) is the same with that in the conventional IGBT. Emitter electrode 10a is in contact with the p-type base region 2 surface and the n-type emitter region 5a surface and connected electrically to p-type base region 2 and n-type emitter region 5a. Gate electrode 8 is formed above the p-type base region 2 between the n-type emitter region 5a surface and the n$^-$-type drift layer 1 surface with gate insulator film 7 interposed therebetween for configuring a MOS-gate structure.

Collector electrode 12a is formed on collector region 25 formed on the back surface side of the semiconductor substrate such that collector electrode 12a is covering collector region 25 and in electrical contact with collector region 25. In the side wall of the semiconductor substrate, isolation region 24 is formed such that isolation region 24 is in contact with collector region 25 on the back surface side and p-type region 13 on the front surface side and connecting the substrate major surfaces. The pn-junction 14 plane formed by disposing isolation region 24 has a shape that encloses the MOS-gate structure formed in active section 40 of the device. The pn-junction 14 sustains the reverse blocking capability of the device.

When a voltage is applied in the reverse direction (when the voltage applied to emitter terminal 27 is higher than the voltage applied to collector terminal 26), depletion layer 16 represented by the broken lines expands to the n$^-$-type drift layer 1 side as the voltage applied in the reverse direction (hereinafter referred to as the "reverse voltage") rises. The area, in which the front edge of depletion layer 16 crosses the semiconductor substrate surface, is protected by insulating protector film 18.

The region under the semiconductor substrate surface protected by insulating protector film 18 is breakdown withstanding section 30. The breakdown withstanding structure such as field limiting ring (hereinafter referred to as "FLR") 17 formed in breakdown withstanding section 30 relaxes the electric field strength, which tends to be high in the vicinity of the semiconductor substrate surface. Due to the relaxation effect, the electric field strength in the vicinity of the semiconductor substrate surface is made to be lower than the electric field strength in the collector junction and the reverse blocking capability of the semiconductor device is made to be more reliable (cf. the following Patent Document 1).

The band gap of silicon carbide (hereinafter referred to sometimes as "SiC") and gallium nitride (hereinafter referred to sometimes as "GaN") is about tree times as wide as that of silicon (hereinafter referred to sometimes as "Si"). The Critical Electric field of SiC and GaN is about 10 times as high as that of Si. Therefore, the SiC power device and the GaN power device, exhibiting the same breakdown voltage with that of the Si power device, facilitate switching faster with a lower ON-voltage. In other words, it is possible for the power device that employs SiC or GaN for the substrate material to set the n⁻-type drift layer 1 thickness (cf. FIG. 17) about one tenth as thick as the n⁻-type drift layer thickness in the Si power device at the same breakdown voltage.

The n⁻-type drift layer 1 thickness that provides a vertical SiC power device or a vertical GaN power device with a breakdown voltage of the 1200 V class is around 15 μm. The n⁻-type drift layer 1 thickness that provides a vertical SiC power device or a vertical GaN power device with a breakdown voltage of the 600 V class is 10 μm or thinner. Since the band gaps of SiC and GaN are wide, the built-in potential of the pn-junction in the SiC power device or the GaN power device will be higher than that of the Si power device, if an IGBT configuration is employed. Therefore, it is hard for the SiC power device and the GaN power device of the 600 V breakdown voltage class or of the 1200 V breakdown voltage class to turn the low ON-voltage to the advantage thereof. Therefore, the manufactures of the SiC device and the GaN device of the above-described breakdown voltage classes have started from the manufactures of the MOSFET and the junction field-effect transistor (hereinafter referred to as the "J-FET"), in which the main current does not flow via the pn-junction in the ON-state of the devices.

However, the MOSFET and the J-FET do not include any junction that sustains the voltage applied in the reverse direction. In other words, the MOSFET and the J-FET do not exhibit the reverse blocking capability characteristics. For applying SiC and GaN to the reverse-blocking device, it may be worthwhile to form a Schottky junction between the drain electrode and the n⁻-type drift layer. If the junction between the drain electrode and the n⁻-type drift layer is a Schottky junction, the semiconductor substrate thickness will be the n⁻-type drift layer thickness, which is from 10 μm to 15 μm, necessary for the SiC device exhibiting a breakdown voltage between 600 V and 1200 V. The resulting semiconductor substrate thickness is too thin to conduct the wafer process without any difficulty.

For obviating the problem described above, the following Patent Document 2 discloses a structure described below. In the disclosed structure, a GaN layer is formed above a thick Si substrate, the resistance thereof is low, via a buffer layer such as an AlN layer interposed between the GaN layer and the Si substrate. A MOS-gate structure is formed in the GaN layer surface. A deep trench, which reaches the GaN layer, is formed from the back surface of the Si substrate layer and a metal electrode for forming a Schottky junction is buried in the deep trench. The trench deep enough to reach the GaN layer is formed from the back surface of Si substrate layer and a metal electrode is buried therein, since it is necessary to bore a hole in the AlN layer, which is an insulator buffer layer.

The following Patent Document 3 discloses a device that has a structure as described below. In the device disclosed in the Patent Document 3, a heavily doped GaN layer and a lightly doped GaN layer are grown epitaxially above a semiconductor substrate in the order of above description with buffer layers interposed between the semiconductor substrate and the heavily doped GaN layer. A trench deep enough to reach the heavily doped GaN layer is formed from the substrate back surface and an electrically conductive material is buried in the trench. However, the GaN MOSFET described in the Patent Document 3 is not a MOSFET that exhibits a reverse blocking capability.

The following Patent Document 4 discloses an IGBT as described below. In the IGBT disclosed in the Patent Document 4, a trench is formed from the substrate back surface. The trench penetrates a collector layer and reaches an n⁻-type drift layer. An electrically conductive material is buried in the trench. The electrically conductive material is in Schottky contact with the n⁻-type drift layer. However, the Patent Document 4 describes nothing on the MISFET.

Documents Describing the Related Arts

[Patent Document 1] Japanese Unexamined Patent Application Publication No. 2002-319676
[Patent Document 2] Japanese Unexamined Patent Application Publication No. 2010-258327
[Patent Document 3] Japanese Unexamined Patent Application Publication No. 2009-54659 (FIG. 7)
[Patent Document 4] U.S. Pat. No. 7,132,321

The Si IGBT has been known to the persons skilled in the art as an elementary switching device that exhibits a reverse bias blocking capability. In the silicon semiconductor device exhibiting a breakdown voltage of the 600 V class or the 1200 V class, the silicon substrate thickness is usually around 100 μm or 200 μm. Therefore, as the breakdown voltage is higher, the tradeoff relation between the ON-voltage and the switching loss is impaired. If the silicon semiconductor device described above is applied to a matrix converter, the efficiency thereof will be impaired or the device will be too large in size to be used practically.

For realizing a reverse blocking capability in the Si reverse-blocking IGBT, it is necessary to form a deep p⁺-type layer as deep as 100 μm or 200 μm by diffusion. The p⁺-type layer extends from the n⁻-type drift layer front surface to the n⁻-type drift layer back surface. For performing such a deep diffusion as described above, a high temperature and a long diffusion time more than 100 hr are necessary. Therefore, defects are liable to be formed in the n⁻-type drift layer. Since the lead time of the device manufacture becomes long, the manufacturing efficiency is impaired.

Due to the SiC semiconductor band gap and the GaN semiconductor band gap wider than the Si semiconductor band gap, a large built-in potential is caused, when a current is made to flow in the forward direction. As a result, when a power device exhibiting a breakdown voltage of the 600 V class or the 1200 V class is made of SiC or GaN, the ON-voltage of the power device is too high. Therefore, the SiC power device and the GaN power device are not practical.

For providing the SiC MOSFET, the GaN MOSFET, the SiC J-FET, and the GaN J-FET, exhibiting a breakdown voltage of the 600 V class or the 1200 V class, with a reverse bias blocking capability, it is necessary to form a Schottky junction directly on the n⁻-type drift layer, the thickness thereof is 10 μm or less or 15 μm (the semiconductor substrate thickness). Therefore, difficulties are caused in the wafer handling in the manufacturing process.

If a deep trench that extends from the Si substrate back surface to the GaN layer is formed and a metal electrode that provides a Schottky junction is buried in the trench as described in the Patent Document 2, many defects will be caused in the GaN layer and it will be hard to obtain a sufficient breakdown voltage.

In view of the foregoing, it would be desirable to provide a wide-band-gap reverse-blocking MOS-type semiconductor device that makes a current high enough for the power device flow with a low ON-state voltage drop and exhibits a very reliable reverse blocking capability, when the wide-band-gap semiconductor materials such as SiC and GaN are used for the main semiconductor substrate material.

SUMMARY

Additional aspects and/or advantages will be set forth in part in the description which follows and, in part, will be apparent from the description, or may be learned by practice of the invention.

According to an aspect of the invention, there is provided a wide-band-gap reverse-blocking MOS-type semiconductor device including: a wide-band-gap semiconductor layer of a first conductivity type; a semiconductor substrate of a second conductivity type on the side of the first major surface of the wide-band-gap semiconductor layer; a trench formed through the semiconductor substrate, the trench extending into the wide-band-gap semiconductor layer; a metal film in the bottom of the trench, the metal film contacting with the wide-band-gap semiconductor layer for forming a Schottky junction; an active section including a MOS-gate structure, the active section being on the side of the second major surface of the wide-band-gap semiconductor layer facing to the area, therein the Schottky junctions are formed; a breakdown withstanding section surrounding the active section; and a trench isolation layer surrounding the breakdown withstanding section, the trench isolation layer extending from the second major surface of the wide-band-gap semiconductor layer into the semiconductor substrate, the trench isolation layer including an insulator film buried therein.

Advantageously, the area, therein the Schottky junctions are formed, is within the range defined by projecting the surface of the MOS-gate structure to the side of the first major surface of the wide-band-gap semiconductor layer at a projection angle of 45 degrees of angle or wider from the surface of the MOS-gate structure.

Advantageously, the wide-band-gap semiconductor layer of the first conductivity type is a silicon carbide semiconductor layer, and the semiconductor substrate of the second conductivity type is a silicon carbide semiconductor substrate of the second conductivity type.

Advantageously, the silicon carbide semiconductor substrate of the second conductivity type is doped more heavily than the wide-band-gap semiconductor layer of the first conductivity type.

Advantageously, the wide-band-gap semiconductor layer of the first conductivity type is a gallium nitride semiconductor layer, and the semiconductor substrate of the second conductivity type is a silicon semiconductor substrate of the second conductivity type.

Advantageously, the wide-band-gap reverse-blocking MOS-type semiconductor device further includes an aluminum nitride buffer layer between the gallium nitride semiconductor layer and the silicon semiconductor substrate of the second conductivity type.

Advantageously, the wide-band-gap reverse-blocking MOS-type semiconductor device is a MOSFET or a MISFET.

The wide-band-gap reverse-blocking MOS-type semiconductor device according to embodiments of the invention, which employs a wide-band-gap semiconductor material such as SiC and GaN for the main substrate material, facilitates making a current, high enough for the power device, flow with a low ON-voltage and exhibits a very reliable reverse blocking capability.

BRIEF DESCRIPTION OF THE DRAWINGS

These and/or other aspects and advantages will become apparent and more readily appreciated from the following description of the embodiments, taken in conjunction with the accompanying drawings of which:

FIG. 16(a) is the equivalent circuit diagram of a two-way switching device.

FIG. 16(b) is the equivalent circuit diagram of another two-way switching device.

FIG. 17 is the cross sectional view of a conventional Si reverse-blocking IGBT showing the breakdown withstanding section and the vicinity thereof schematically.

DESCRIPTION OF EMBODIMENTS

Now embodiments of the invention will be described in detail hereinafter with reference to the accompanied drawings which illustrate the preferred embodiments of the invention.

Although the invention is described in connection with embodiments thereof, changes and modifications are obvious to the persons skilled in the art without departing from the true spirit of the invention. Therefore, the invention is to be understood not by the specific descriptions herein but by the appended claims thereof.

Figure 1:
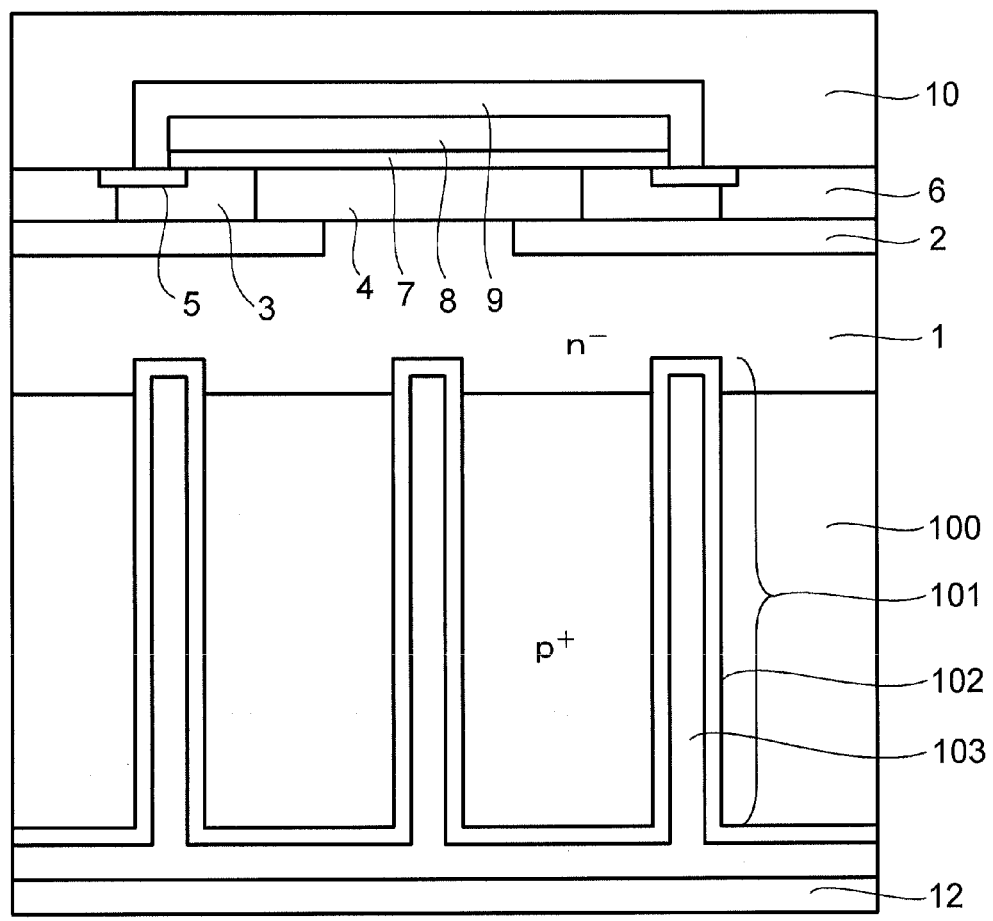
FIG. 1 is the cross sectional view of a SiC reverse-blocking MOSFET according to a first embodiment of the invention showing the active section thereof.

FIG. 1 is the cross sectional view of a SiC reverse-blocking MOSFET according to a first embodiment of the invention.

As shown in FIG. 1, the SiC reverse-blocking MOSFET according to the first embodiment includes p$^+$-type SiC substrate 100 and n$^-$-type SiC layer 1 doped more lightly than substrate 100 and formed on one major surface of substrate 100. In the surface portion of n$^-$-type SiC layer 1, a MOS-gate structure described later is formed. Above the MOS-gate structure, source electrode 10 is formed with interlayer insulator film (BPSG) 9 interposed between source electrode 10 and the MOS-gate structure. Source electrode 10 is connected to n$^+$-type source region 5, p$^+$-type base region 2, and p$^+$-type body region 6.

The p$^+$-type SiC substrate 100 includes trench 101 extending from the other major surface of p$^+$-type SiC substrate 100 into lightly doped n$^-$-type SiC layer 1. On the inner surface of trench 101, metal film 102 is formed as an electrically conductive film. Further, heavily doped amorphous silicon layer 103 is buried in trench 101. According to the first embodiment, metal film 102 functions as a Schottky electrode that forms a Schottky junction together with n$^-$-type SiC layer 1. Titanium (Ti) is used for the Schottky electrode and, then, nickel and gold (Ni—Au) are plated. In substitution for heavily doped amorphous silicon layer 103, a metal or a solder, the linear expansion coefficient thereof is close to the SiC linear expansion coefficient, may be loaded in the trench with no problem.

Now the method of manufacturing the SiC reverse-blocking MOSFET according to the first embodiment will be described below with reference to FIGS. 2 through 6. FIGS. 2 through 6 are the cross sectional views of the SiC reverse-blocking MOSFET according to the first embodiment describing the manufacturing steps thereof.

Figure 2:
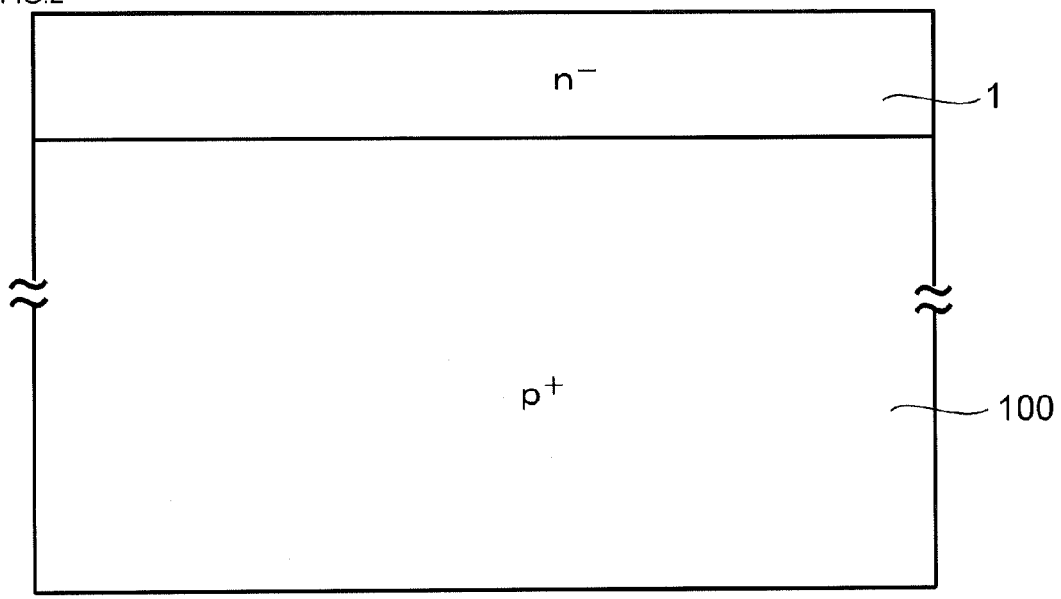
FIG. 2 is the first cross sectional view of the SiC reverse-blocking MOSFET according to the first embodiment describing a first manufacturing step thereof.

Referring at first to FIG. 2, p$^+$-type 4H—SiC substrate 100, 75 mm in diameter, 300 μm in thickness, and the major surface thereof is an (0001) Si plane, is prepared. On SiC substrate 100, n$^-$-type SiC layer 1 is grown epitaxially by the chemical vapor deposition (CVD) method well known to the persons skilled in the art. The impurity concentration in n$^-$-type SiC layer 1 is set to be $1.8 \times 10^{16}$ cm$^{-3}$. Silane (SiH$_4$) gas is used for the silicon material. Propane (C$_3$H$_8$) gas is used for the carbon material. Arsine (AsH$_3$) and stibine (SbH$_3$) are used for the dopant materials.

Figure 3:
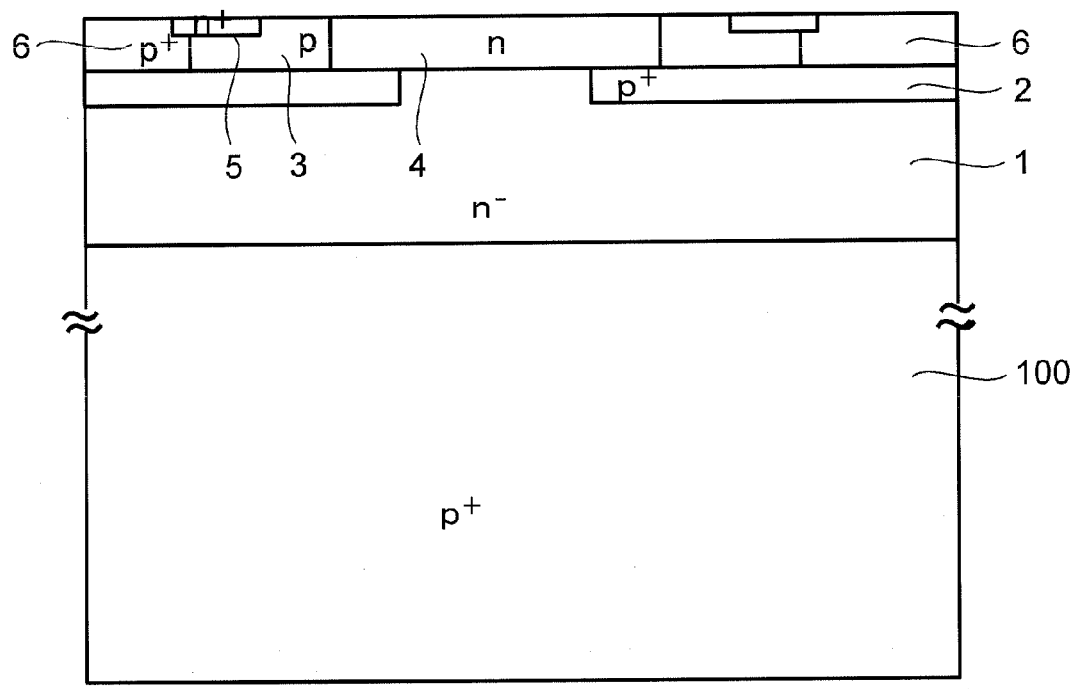
FIG. 3 is the second cross sectional view of the SiC reverse-blocking MOSFET according to the first embodiment describing a second manufacturing step thereof.

Referring now to FIG. 3, a predetermined pattern is formed in the surface of n$^-$-type SiC layer 1 by photolithography and Al ions are irradiated at 600° C. and at the dose amount of around $1 \times 10^{15}$ cm$^{-2}$. After removing the pattern, rapid thermal annealing (RTA) is conducted at 1700° C. for about 2 min to activate the irradiated Al atoms and further to form selective p$^+$-type SiC layer 2.

Using trimethyl indium (In(CH$_3$)$_3$) as a dopant gas, p-type SiC layer 3 is grown epitaxially by the CVD method on the entire surface of p$^+$-type SiC layer 2 such that the impurity concentration in p-type SiC layer 3 is $5 \times 10^{15}$ cm$^{-3}$. Then, n-type J-FET region 4, n$^+$-type source region 5, and p$^+$-type contact region 6 are formed in the predetermined areas in the major surface of p-type SiC layer 3 through the photolithographic step, the high-temperature ion implantation step, and the RTA step. The impurity concentrations in n-type J-FET region 4, n$^+$-type source region 5, and p$^+$-type contact region 6 are set to be $2 \times 10^{16}$ cm$^{-3}$, $3 \times 10^{20}$ cm$^{-3}$, and $1 \times 10^{19}$ cm$^{-3}$, respectively. The acceleration energy, at which the ion implantation for forming n-type J-FET region 4 and the ion implantation for forming p$^+$-type contact region 6 are conducted, is changed from 40 keV to 460 keV so that the ion species may reach a deep region.

Figure 4:
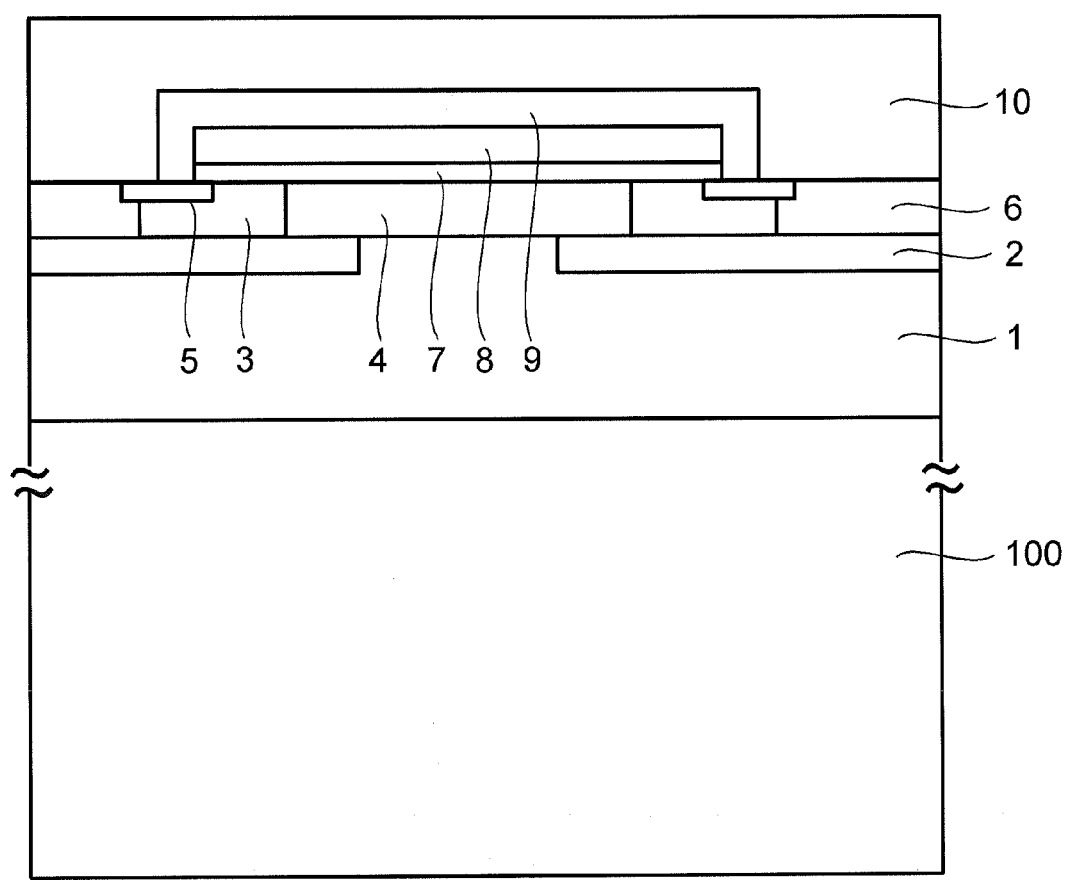
FIG. 4 is the third cross sectional view of the SiC reverse-blocking MOSFET according to the first embodiment describing a third manufacturing step thereof.

After conducting RTA at 1700° C. for about 2 min, SiC is treated thermally in an oxygen atmosphere to form gate insulator film 7, 70 nm in thickness, as shown in FIG. 4. On gate insulator film 7, heavily doped polysilicon is deposited to the thickness of 0.5 μm by the CVD method. The deposited polysilicon is etched in a predetermined pattern through the photolithographic and etching steps to form gate electrode 8 and further to obtain the MOS-gate structure described above.

Then, boro phospho silicate glass (BPSG) film 9, 1.0 μm in thickness, is formed as an interlayer insulator film by the CVD method. BPSG film 9 is shaped with a predetermined pattern through the photolithographic and etching steps. Although a silicon oxide film is used for gate insulator film 7 according to the first embodiment, a silicon nitride film and such an insulator film other than the silicon oxide film may be used alternatively with no problem. A laminate film of nickel (Ni) and titanium (Ti) is formed as source electrode 10 on n$^+$-type source region 5 and p$^+$-type contact region 6 so that source electrode 10 may be in ohmic contact with n$^+$-type source region 5 and p$^+$-type contact region 6.

The p$^+$-type SiC substrate 100, 300 μm in thickness, is ground from the back surface thereof to reduce the thickness thereof to 50 μm. According to the first embodiment, the back grinding is conducted to shorten the period of time necessary for conducting the trench etching from the back surface of p$^+$-type SiC substrate 100. When SiC substrate 100 is much thinner than 300 μm, for example close to 50 μm, the step of back grinding may be omitted.

Then, an aluminum film is deposited to the thickness of 1.5 μm on the ground back surface of p$^+$-type SiC substrate 100. An aluminum mask consisting of stripes, 5 μm in width and spaced apart for 10 μm from each other, is formed through the photolithographic and etching steps.

Figure 5:
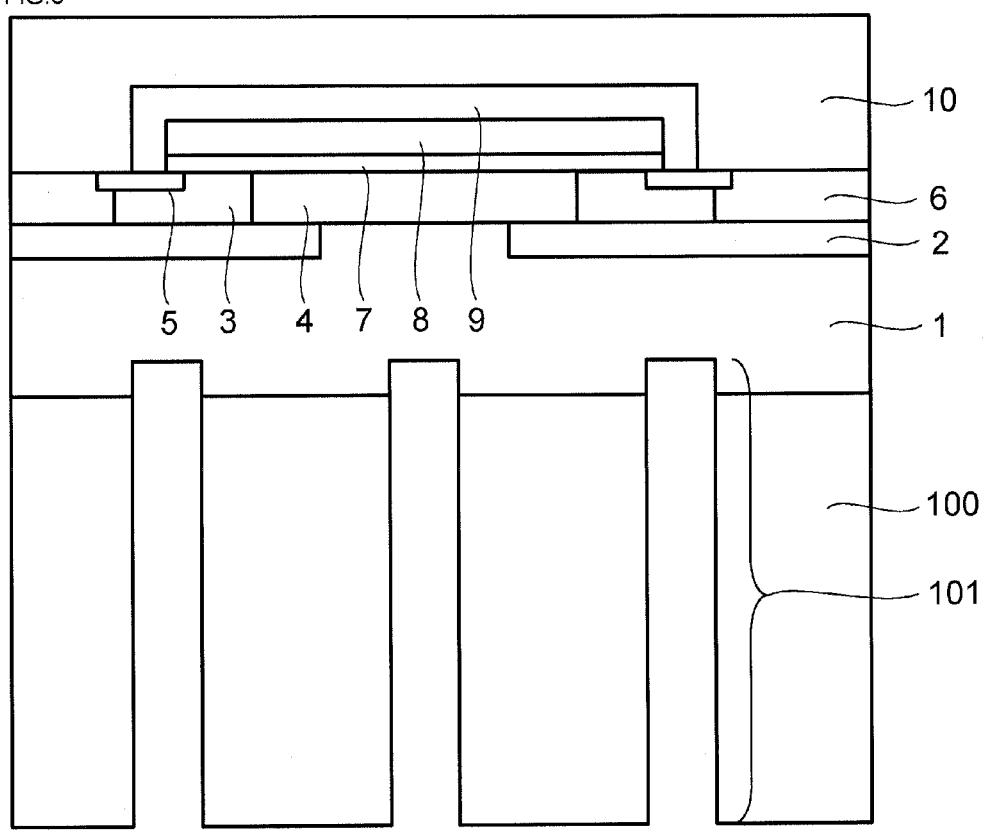
FIG. 5 is the fourth cross sectional view of the SiC reverse-blocking MOSFET according to the first embodiment describing a fourth manufacturing step thereof.

Referring now to FIG. 5, a trench pattern is formed in the back surface of p$^+$-type SiC substrate 100 by etching using the aluminum mask for a trench etching mask. As shown in FIG. 5, the trench etching is conducted deep enough to make trench 101 reach n$^-$-type SiC layer 1 and to make n$^-$-type SiC layer 1 come out to the top edge area (bottom) of trench 101.

Then, the aluminum mask (not shown) is removed.

Figure 6:
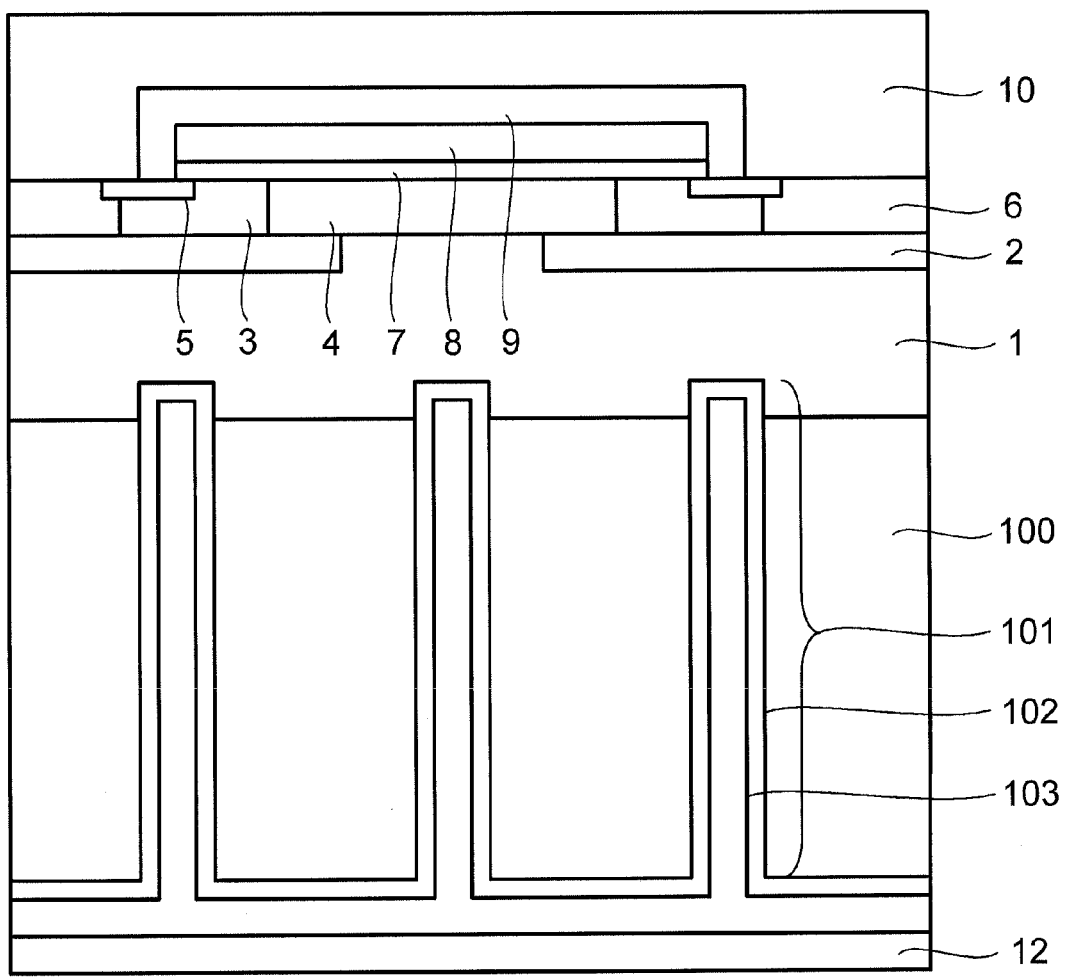
FIG. 6 is the fifth cross sectional view of the SiC reverse-blocking MOSFET according to the first embodiment describing a fifth manufacturing step thereof.

Referring now to FIG. 6, Ti film 102 and heavily doped amorphous silicon 103 are deposited in the order of the above description from the back surface of p$^+$-type SiC substrate 100 such that heavily doped amorphous silicon 103 is buried in trench 101 with Ti film 102 interposed between amorphous silicon 103 and trench 101. A Ni film and a Au film are deposited to form drain electrode 12. Ti film 102 formed on the inner surface of trench 101 and n$^-$-type SiC layer 1 form a Schottky junction. The Schottky junction sustains the reverse voltage, when a voltage that biases the drain electrode 12 side at a negative potential is applied between drain electrode 12 and source electrode 10.

The SiC reverse-blocking MOSFET according to the first embodiment includes trench 101 formed from the back surface of p$^+$-type SiC substrate 100 and deep enough to reach n$^-$-type SiC layer 1, and Ti film 102 that forms a Schottky junction with n$^-$-type SiC layer 1 in the top edge area (bottom) of trench 101. Therefore, the SiC reverse-blocking MOSFET according to the first embodiment is advantageous to obtain an effective reverse blocking capability, even if the space that includes no Schottky junction therein is wide between trenches 101.

Figure 7:
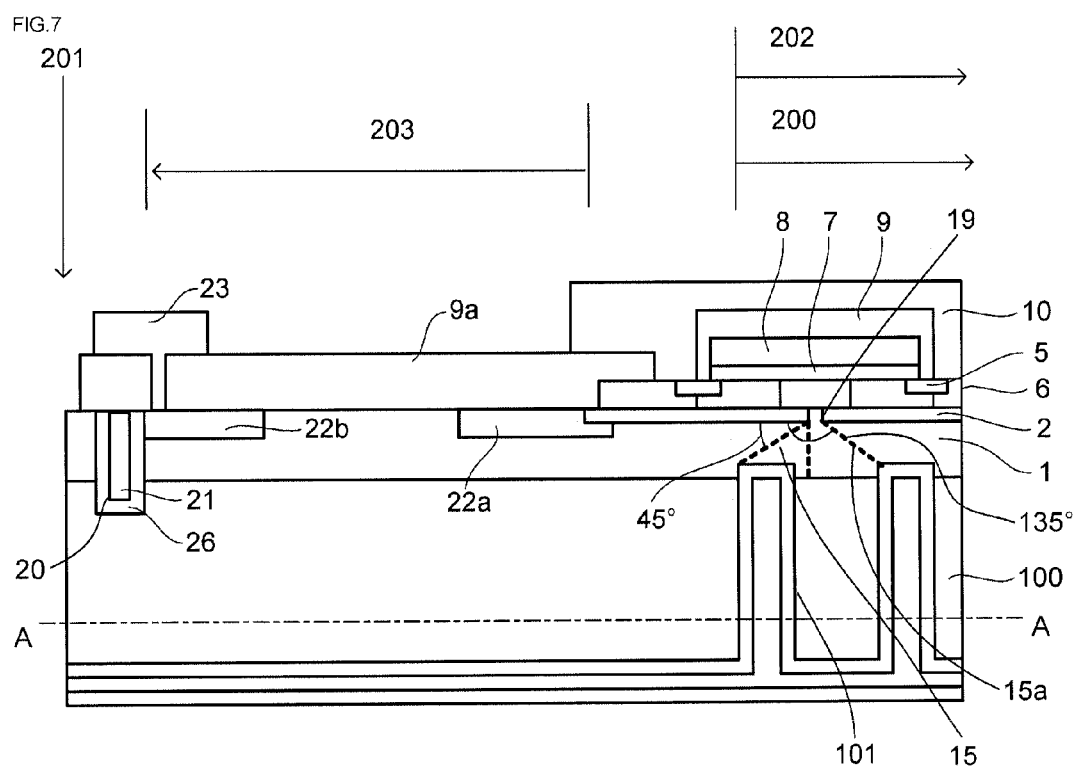
FIG. 7 is the cross sectional view of the SiC reverse-blocking MOSFET according to the first embodiment showing the chip edge area thereof including the breakdown withstanding section and a part of the active section.
Figure 8:
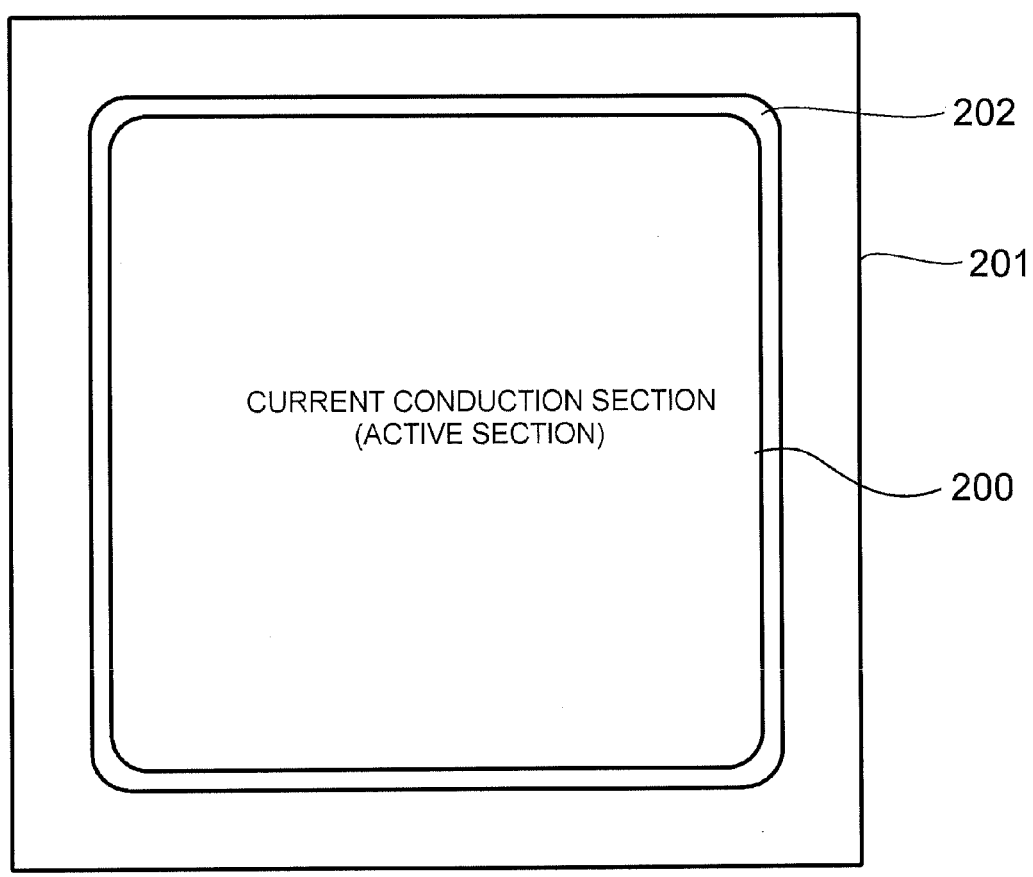
FIG. 8 is the horizontal cross sectional view of the entire chip of the SiC reverse-blocking MOSFET according to the first embodiment along the single-dotted chain line A-A in FIG. 7.

FIG. 7 is the cross sectional view of the SiC reverse-blocking MOSFET according to the first embodiment schematically showing the chip edge area thereof including breakdown withstanding section 203 and a part of active section 200. FIG. 8 is the horizontal cross sectional view of the entire chip of the SiC reverse-blocking MOSFET according to the first embodiment along the single-dotted chain line A-A in FIG. 7.

If the angle between broken line 15, which connects opening 19 in p+-type base region 2 and the outermost trench 101, and the p+-type base region 2 surface is set to be 45 degrees of angle or wider as shown in FIG. 7, it will be possible to prevent a current from localizing to the MOS-gate structure on the chip edge side. FIG. 8 is the cross sectional view along the single-dotted chain line A-A, in which the angle between broken line 15, which connects opening 19 in p+-type base region 2 and the outermost trench 101, and the p+-type base region 2 surface is 45 degrees of angle. However, no problem will be posed, if the angle between broken line 15 and the p+-type base region 2 surface is set to be wider than 90 degrees of angle (e.g. 135 degrees of angle) such that section 202 on the chip center side of the outermost trench 101 is narrower than active section 200, in which a main current flows, although not illustrated.

Breakdown withstanding section 203 is formed in the active section 200 periphery such that breakdown withstanding section 203 surrounds active section 200. Breakdown withstanding section 203 includes a junction termination extension (hereinafter referred to as a "JTE") including p-type JTE regions 22a and 22b, and insulating protector film 9a that protects the substrate surface in breakdown withstanding section 203.

In the outer edge area of breakdown withstanding section 203, trench isolation layer 20 extending from the second major surface of n−-type SiC layer 1 to p+-type SiC substrate 100 is formed. Trench isolation layer 20 includes p-type layer 26 and insulator film 21. The p-type layer 26 is formed by an oblique ion implantation into the side wall and bottom plane of a trench and by a subsequent thermal treatment such that p-type layer 26 surrounds the trench. The space surrounded by p-type layer 26 is filled with insulator film 21. Further, JTE 22 (p-type JTE region 22b) is formed such that p-type JTE region 22b is in contact with insulator film 21 to extend the junction toward the chip center side. Further, the p-type JTE region 22b is in contact with channel stopper 23.

The electric field relaxation structure including trench isolation layer 20 as described above facilitates expanding a depletion layer, improving the reverse blocking capability, and preventing the depletion layer from contacting directly with the crystal defects caused by dicing the wafer into chips. As a result, a very reliable reverse blocking capability is secured. The p-type JTE region 22a (that is JTE 22), in contact with the outer edge of SiC p+-type base region 2 and extending the junction toward the chip edge side is an electric field relaxation structure for improving the forward withstand voltage.

Now trench isolation layer 20 will be described more in detail below. In cutting the wafer on device edge 201 for dicing the wafer into chips, many crystal detects are caused in the vicinity of the cutting plane on device edge 201 by the damages such as cracks due to the dicing. If the depletion layer meets the crystal detects, a leakage current will be caused and a sufficient reverse blocking capability will not be obtained. By disposing trench isolation layer 20 on the chip center side of the cutting plane as described above, the cracks caused by the dicing are stopped so that the cracks may not advance to the chip center side of trench isolation layer 20. Therefore, the depletion layer expanding on the chip center side of trench isolation layer 20 is prevented from expanding into the area, in which crystal defects are caused. Therefore, the leakage current is suppressed to be extremely small and an improved reverse blocking capability is obtained.

Thus, the vertical SiC reverse-blocking MOSFET according to the first embodiment of the invention that includes the structures as described above is completed.

Figure 9:
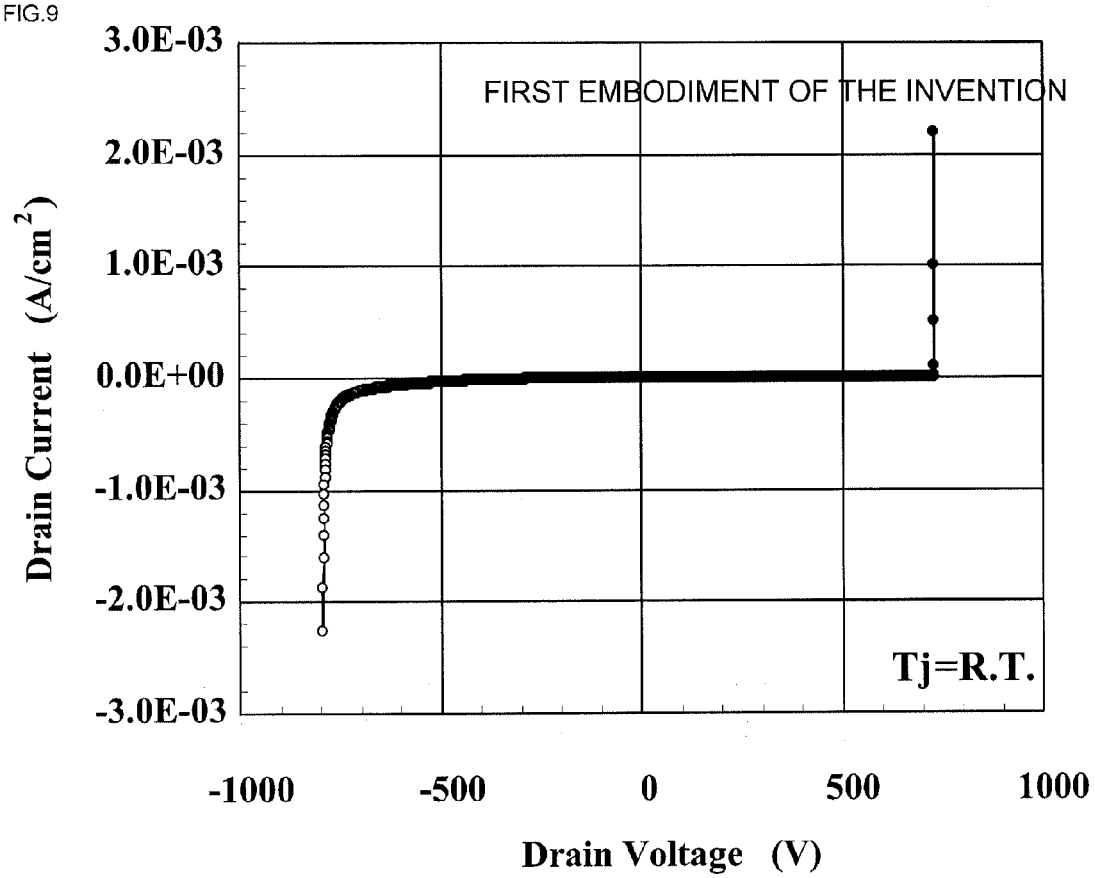
FIG. 9 is the forward and reverse blocking capability characteristics of the SiC reverse-blocking MOSFET according to the first embodiment.
Figure 10:
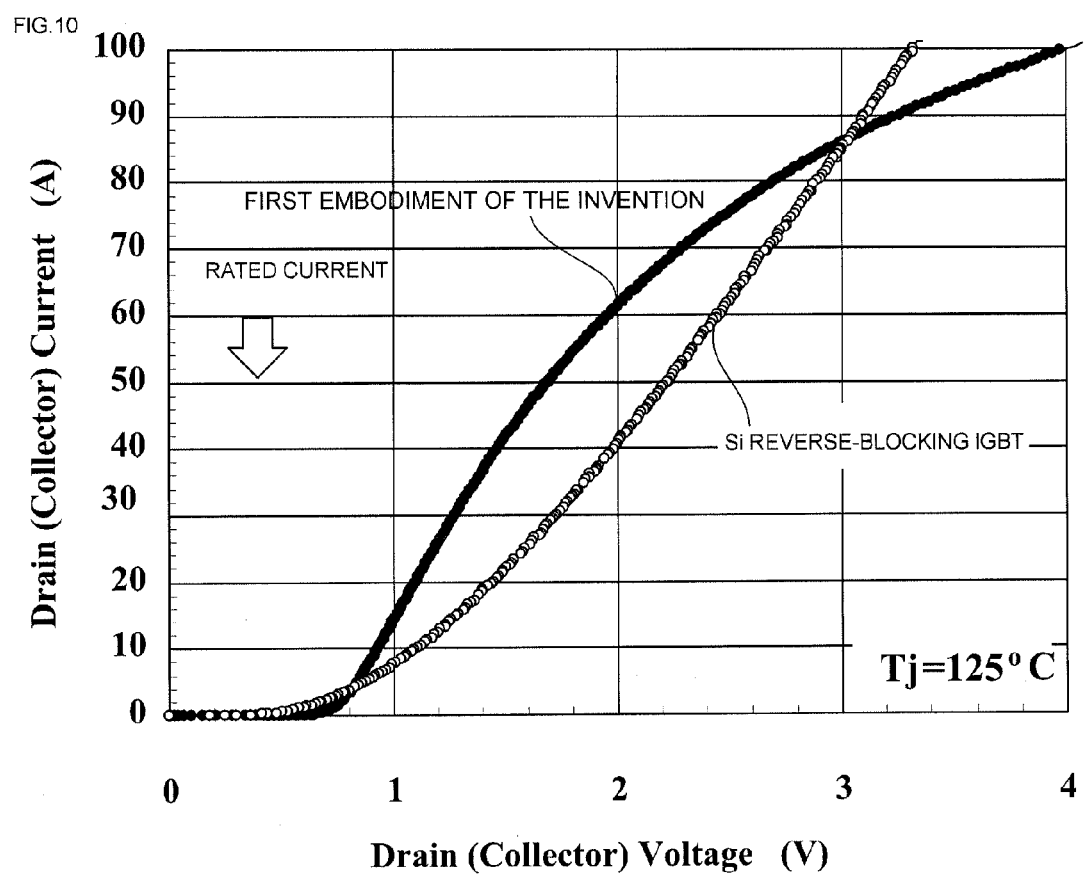
FIG. 10 is the pair of curves comparing the I-V characteristics in the ON-state of the SiC reverse-blocking MOSFET according to the first embodiment and the Si reverse-blocking IGBT.

FIG. 9 is the forward and reverse blocking capability characteristics of the SiC reverse-blocking MOSFET according to the first embodiment. FIG. 10 is the pair of curves comparing the I-V characteristics in the ON-state of the SiC reverse-blocking MOSFET according to the first embodiment and a Si reverse-blocking IGBT for comparison.

The forward withstand voltage of the SiC reverse-blocking MOSFET according to the first embodiment is about 750 V and the reverse blocking capability thereof (not shown) is about 800 V. Therefore, the SiC reverse-blocking MOSFET according to the first embodiment exhibits sufficient blocking performances as a device that exhibits a breakdown voltage of the 600 V class. The chip size of the device used for the measurements is 5 mm×5 mm and the rated current thereof is 50 A (the active section area is 0.2 cm$^2$ and the rated current density is 250 A/cm$^2$). The rated current of the comparative Si reverse-blocking IGBT is 50 A (the rated current density is 250 A/cm$^2$). The current-voltage (I-V) characteristics in the ON-state of the comparative Si reverse-blocking IGBT are described in FIG. 10.

Figure 11:
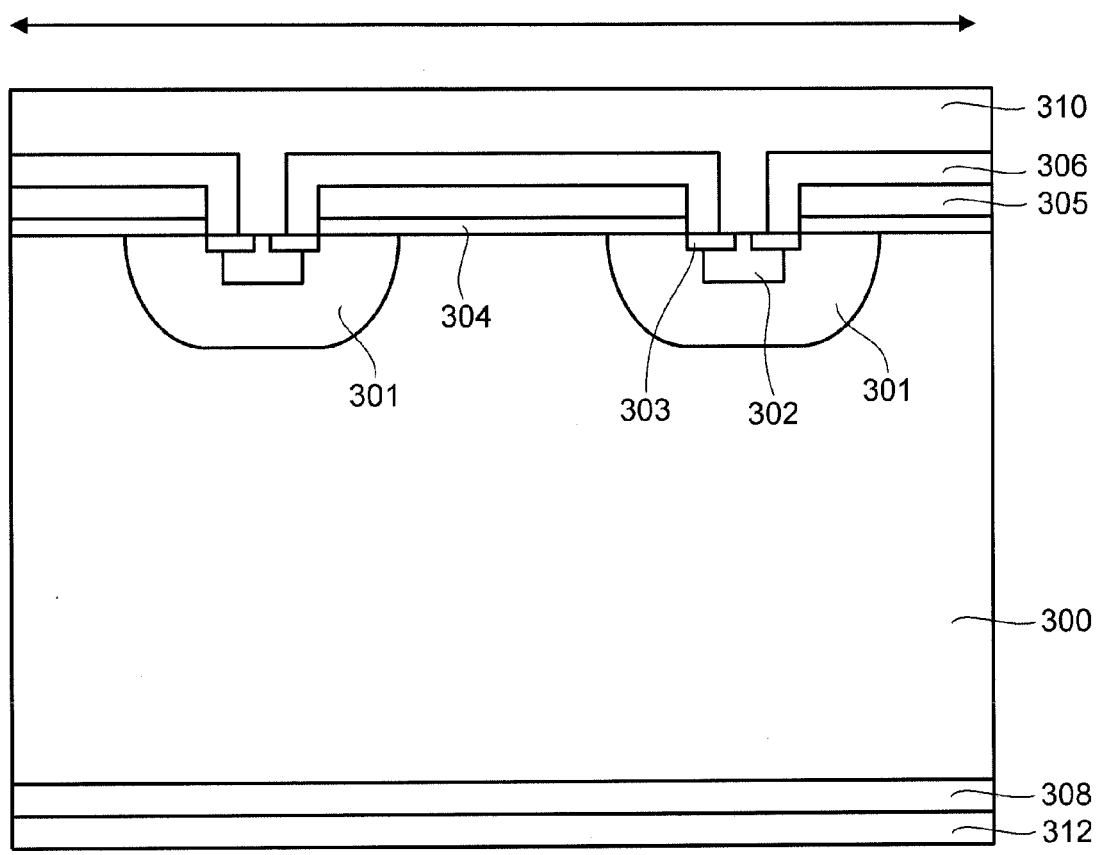
FIG. 11 is the cross sectional view of the conventional Si reverse-blocking IGBT showing the active section thereof.
Figure 12:
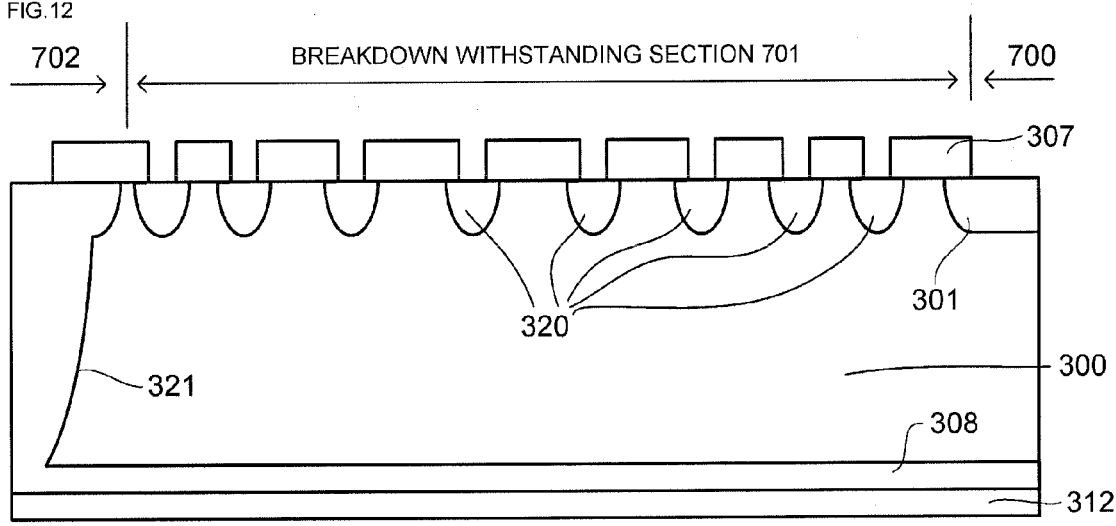
FIG. 12 is the cross sectional view of the conventional Si reverse-blocking IGBT showing the breakdown withstanding section and the vicinity thereof.

FIG. 11 is the cross sectional view of the conventional Si reverse-blocking IGBT used for the comparison and showing the active section thereof. FIG. 12 is the cross sectional view of the conventional Si reverse-blocking IGBT showing the breakdown withstanding section and the vicinity thereof.

As shown in FIG. 11, active section 700 includes p-type base region 301 formed in the major surface of n−-type drift layer 300 and n-type emitter region 303 formed in the surface portion of p-type base region 301. A plurality of p-type base regions 301 is arranged in an island-shaped planar pattern or in a stripe-shaped planar pattern. Polysilicon gate electrode 305 is formed above the extended portion of p-type base region 301 extended between n−-type drift layer 300 and n-type emitter region 303 with gate insulator film 304 interposed between gate electrode 305 and the extended portion of p-type base region 301, forming a MOS-gate structure. Gate electrode 305 and gate insulator film 304 constitute a common MOS-gate structure common to the adjacent p-type base regions 301. Emitter electrode 310 is formed on n-type emitter region 303 and p+-type body region 302 such that emitter electrode 310 is in common electrical contact with n-type emitter region 303 and p+-type body region 302. On the other major surface of n−-type drift layer 300, collector region 308 is formed, and collector electrode 312 is formed on collector region 308.

As shown in FIG. 12, breakdown withstanding section 701 is formed around active section 700 of the Si reverse-blocking IGBT. Breakdown withstanding section 701 includes an electric field relaxation structure including a plurality of ring-shaped field limiting rings (FLR's) 320 formed in the periphery of active section 700. Insulating protector film 307 is formed on FLR 320.

In device termination section 702 on the chip edge side of breakdown withstanding section 701, p+-type junction separation region 321 is formed from the front surface of n−-type drift layer 300 deep enough to reach collector region 308 on the back surface side of n−-type drift layer 300. The thickness of n−-type drift layer 300 in the Si reverse-blocking IGBT exhibiting a breakdown voltage of the 600 V class is about 100 μm.

The turnoff characteristics at 125° C. of the SiC reverse-blocking MOSFET according to the first embodiment include the Eoff of 1.9 mJ. The Eoff of the Si reverse-blocking IGBT is 2.0 mJ. The ON-voltage of the SiC reverse-blocking MOSFET according to the first embodiment is 1.62 V. If compared with the ON-voltage of the Si reverse-blocking IGBT, that is 2.20 V, a sufficiently low ON-voltage value is obtained by the SiC reverse-blocking MOSFET according to the first embodiment. Therefore, it is confirmed that the SiC reverse-blocking MOSFET according to the first embodiment facilitates reducing the losses. The ON-voltage is lowered, as described above, by the SiC reverse-blocking MOSFET according to the first embodiment that has a structure, in which a trench is formed from the back surface of the substrate, a Schottky junction is formed in the trench bottom, and the Schottky junction is used for a drain electrode. Therefore, it is obvious that the SiC reverse-blocking MOSFET according to the first embodiment functions effectively as a vertical switching device.

Figure 13:
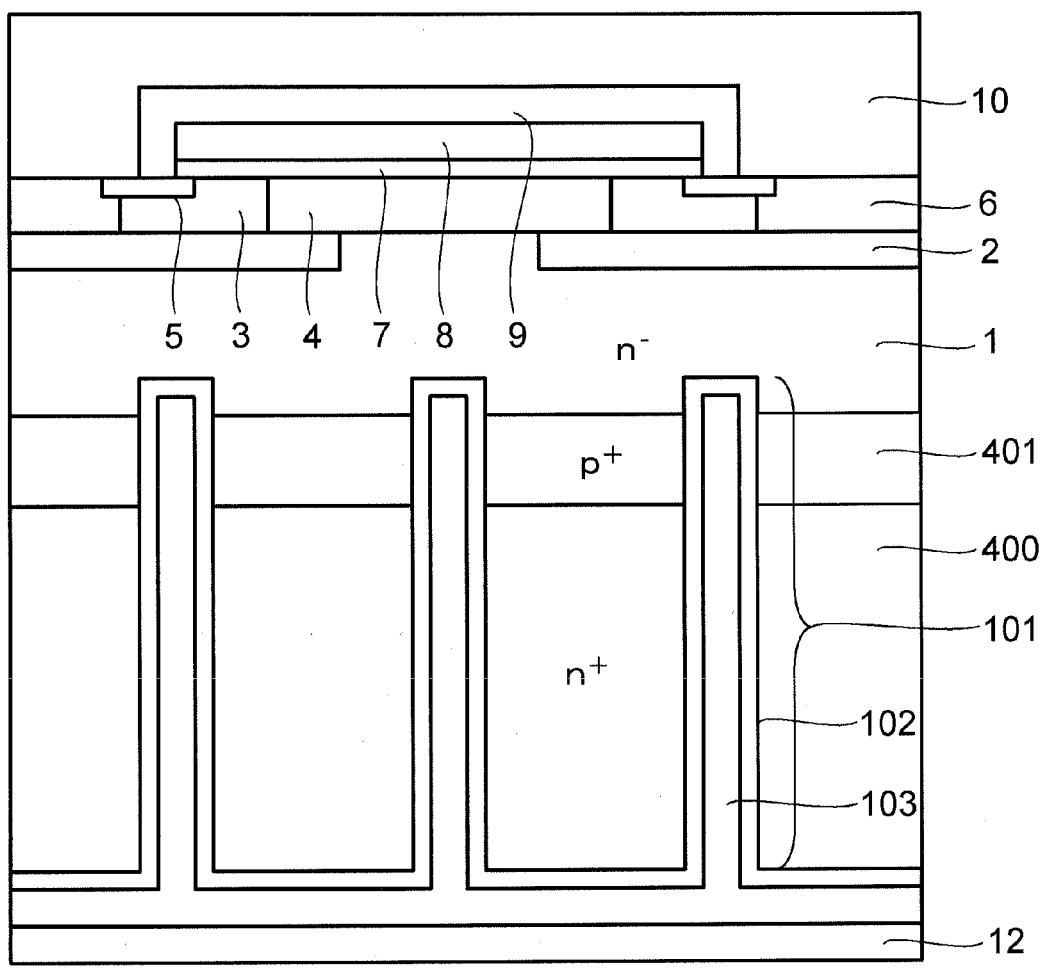
FIG. 13 is the cross sectional view of a SiC reverse-blocking MOSFET according to a second embodiment of the invention.

FIG. 13 is the cross sectional view of a SiC reverse-blocking MOSFET according to a second embodiment of the invention. The SiC reverse-blocking MOSFET according to the second embodiment includes a laminate including $n^+$-type substrate 400 and SiC $p^+$-type epitaxial layer 401 on $n^+$-type substrate 400 in substitution for SiC $p^+$-type substrate 100.

Figure 14:
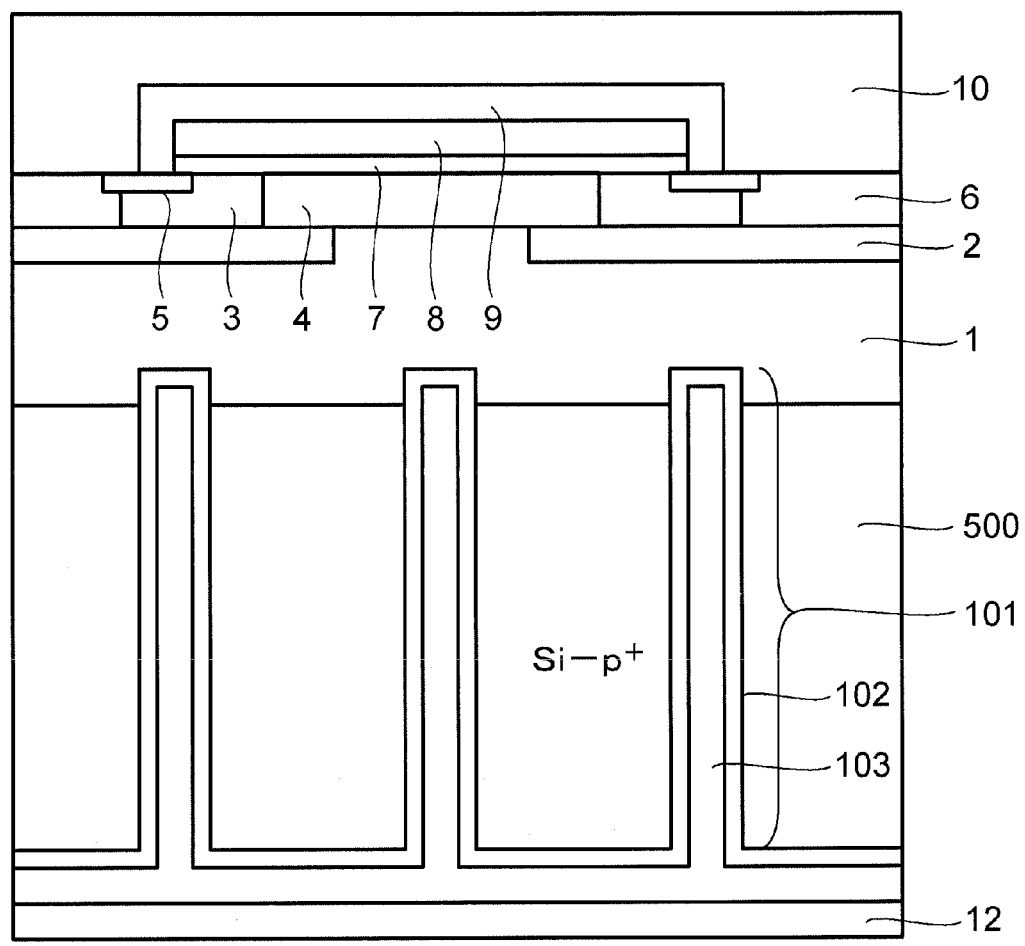
FIG. 14 is the cross sectional view of a SiC reverse-blocking MOSFET according to a third embodiment of the invention.

FIG. 14 is the cross sectional view of a SiC reverse-blocking MOSFET according to a third embodiment of the invention. The SiC reverse-blocking MOSFET according to the third embodiment includes Si $p^+$-type substrate 500 in substitution for SiC $p^+$-type substrate 100.

Figure 15:
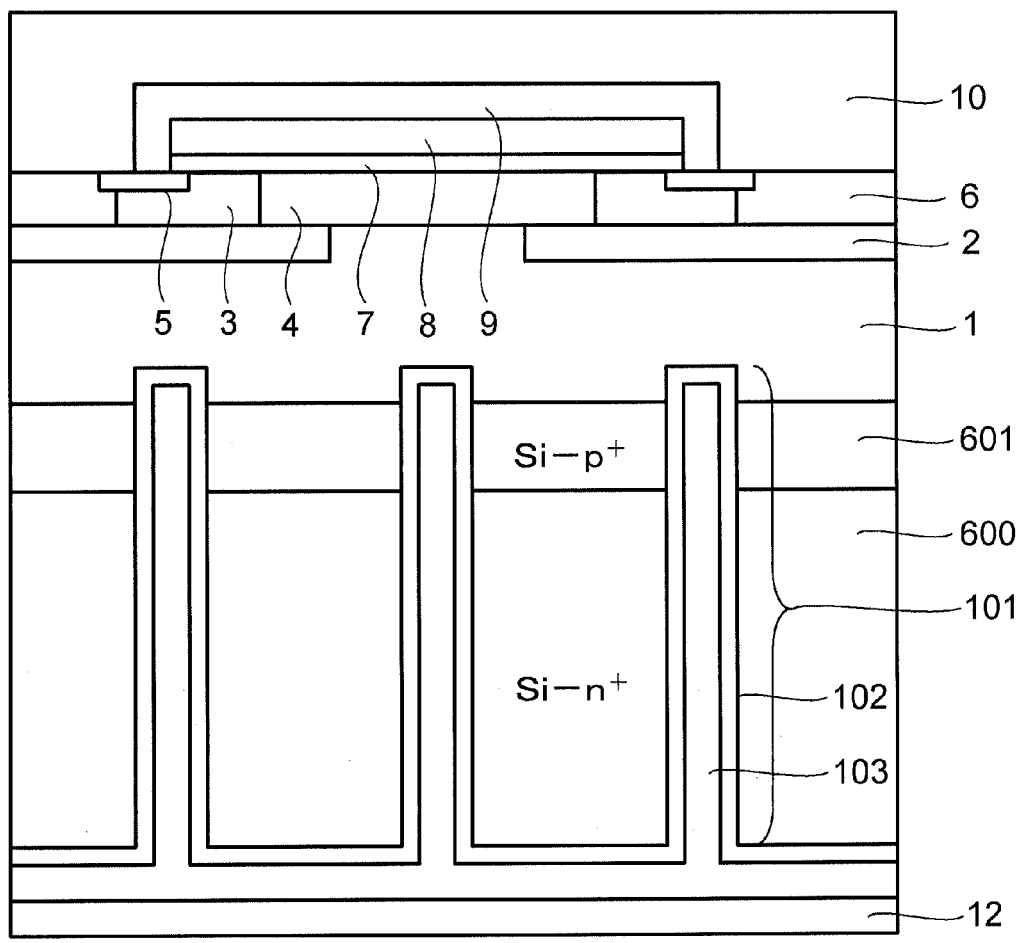
FIG. 15 is the cross sectional view of a SiC reverse-blocking MOSFET according to a fourth embodiment of the invention.

FIG. 15 is the cross sectional view of a SiC reverse-blocking MOSFET according to a fourth embodiment of the invention. The SiC reverse-blocking MOSFET according to the fourth embodiment includes Si $n^+$-type substrate 600 and Si $p^+$-type epitaxial layer 601 on Si $n^+$-type substrate 600 in substitution for SiC $n^+$-type substrate 400 and SiC $p^+$-type epitaxial layer 401 on $n^+$-type substrate 400 shown in FIG. 13.

As described above, no problem will be posed, if the substrate material facilitates growing SiC epitaxially thereon and the layer in contact with $n^-$-type drift layer 1 is a $p^+$-type semiconductor layer. If a GaN semiconductor layer is employed in substitution for the SiC semiconductor layer, the effects, the same with the effects, which the SiC reverse-blocking MOSFET according to embodiments of the invention exhibits, will be obtained.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A wide-band-gap reverse-blocking MOS-type semiconductor device comprising:
    a wide-band-gap semiconductor layer of a first conductivity type;
    a semiconductor substrate of a second conductivity type on a side of a first major surface of the wide-band-gap semiconductor layer;
    a trench formed through the semiconductor substrate, the trench extending into the wide-band-gap semiconductor layer;
    a metal film in a bottom of the trench, the metal film contacting with the wide-band-gap semiconductor layer for forming a Schottky junction;
    an active section comprising a MOS-gate structure, the active section being on a side of a second major surface of the wide-band-gap semiconductor layer facing to an area, therein the Schottky junctions are formed;
    a breakdown withstanding section surrounding the active section; and
    a trench isolation layer surrounding the breakdown withstanding section, the trench isolation layer extending from the second major surface of the wide-band-gap semiconductor layer into the semiconductor substrate, the trench isolation layer comprising an insulator film buried therein.

2. The wide-band-gap reverse-blocking MOS-type semiconductor device according to claim 1, wherein
    the area, therein the Schottky junctions are formed, is within a range defined by projecting a surface of the MOS-gate structure to the side of the first major surface of the wide-band-gap semiconductor layer at a projection angle of 45 degrees of angle or wider from the surface of the MOS-gate structure.

3. The wide-band-gap reverse-blocking MOS-type semiconductor device according to claim 2, wherein
    the wide-band-gap semiconductor layer of the first conductivity type comprises a silicon carbide semiconductor layer, and
    the semiconductor substrate of the second conductivity type comprises a silicon carbide semiconductor substrate of the second conductivity type.

4. The wide-band-gap reverse-blocking MOS-type semiconductor device according to claim 3, wherein
    the silicon carbide semiconductor substrate of the second conductivity type is doped more heavily than the wide-band-gap semiconductor layer of the first conductivity type.

5. The wide-band-gap reverse-blocking MOS-type semiconductor device according to claim 2, wherein
    the wide-band-gap semiconductor layer of the first conductivity type comprises a gallium nitride semiconductor layer, and
    the semiconductor substrate of the second conductivity type comprises a silicon semiconductor substrate of the second conductivity type.

6. The wide-band-gap reverse-blocking MOS-type semiconductor device according to claim 5, the wide-band-gap reverse-blocking MOS-type semiconductor device further comprising:
    an aluminum nitride buffer layer between the gallium nitride semiconductor layer and the silicon semiconductor substrate of the second conductivity type.

7. The wide-band-gap reverse-blocking MOS-type semiconductor device according to claim 1, wherein
    the wide-band-gap reverse-blocking MOS-type semiconductor device comprises a MOSFET or a MISFET.

8. The wide-band-gap reverse-blocking MOS-type semiconductor device according to claim 2, wherein
    the wide-band-gap reverse-blocking MOS-type semiconductor device comprises a MOSFET or a MISFET.

9. The wide-band-gap reverse-blocking MOS-type semiconductor device according to claim 3, wherein
    the wide-band-gap reverse-blocking MOS-type semiconductor device comprises a MOSFET or a MISFET.

10. The wide-band-gap reverse-blocking MOS-type semiconductor device according to claim 4, wherein
    the wide-band-gap reverse-blocking MOS-type semiconductor device comprises a MOSFET or a MISFET.

11. The wide-band-gap reverse-blocking MOS-type semiconductor device according to claim 5, wherein
    the wide-band-gap reverse-blocking MOS-type semiconductor device comprises a MOSFET or a MISFET.

12. The wide-band-gap reverse-blocking MOS-type semiconductor device according to claim 6, wherein
    the wide-band-gap reverse-blocking MOS-type semiconductor device comprises a MOSFET or a MISFET.

* * * * *